United States Patent
Tandou et al.

(10) Patent No.: US 8,034,181 B2
(45) Date of Patent: Oct. 11, 2011

(54) PLASMA PROCESSING APPARATUS

(75) Inventors: Takumi Tandou, Asaka (JP); Ken'etsu Yokogawa, Tsurugashima (JP); Masaru Izawa, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 347 days.

(21) Appl. No.: 11/679,979

(22) Filed: Feb. 28, 2007

(65) Prior Publication Data

US 2008/0203925 A1 Aug. 28, 2008

(51) Int. Cl.
- C23C 16/00 (2006.01)
- C23F 1/00 (2006.01)
- H01L 21/306 (2006.01)

(52) U.S. Cl. .................. 118/724; 156/345.27
(58) Field of Classification Search .................. 118/724; 156/345.27

See application file for complete search history.

(56) References Cited

U.S. PATENT DOCUMENTS

| | | | |
|---|---|---|---|
| 6,951,587 B1 * | 10/2005 | Narushima | 118/728 |
| 2004/0097088 A1 * | 5/2004 | Kitayama et al. | 438/694 |
| 2005/0045104 A1 * | 3/2005 | Arai et al. | 118/724 |
| 2005/0279384 A1 * | 12/2005 | Guidotti | 134/18 |
| 2006/0285270 A1 * | 12/2006 | Lee | 361/234 |

FOREIGN PATENT DOCUMENTS

| JP | 06-346256 | 12/1994 |
|---|---|---|
| JP | 2005-089864 | 4/2005 |

* cited by examiner

*Primary Examiner* — Keath Chen
(74) *Attorney, Agent, or Firm* — Antonelli, Terry, Stout & Kraus, LLP.

(57) ABSTRACT

A plasma processing apparatus includes a processing chamber encased in a vacuum vessel equipped with an evacuator; a sample stage located in the processing chamber and having an upper surface on which a sample as an object to be processed rests; a gas feeding unit for feeding processing gas into the processing chamber; a plurality of refrigerant ducts which are laid out in the internal of the sample stage and through which liquid refrigerant flows and can be evaporated; a cooling circuit including a compressor, a condenser, an expansion valve and a set of pipelines to connect the compressor, the condenser and the expansion valve in this order; and a selecting unit for selectively feeding the refrigerant through the plural refrigerant ducts in the different steps of the processing. The sample is processed by using plasma while the temperature of the sample stage is being controlled by the cooling circuit.

16 Claims, 5 Drawing Sheets

PLASMA PROCESSING APPARATUS

BACKGROUND OF THE INVENTION

This invention relates to a plasma processing apparatus which uses plasma to work the surface of a sample such as a semiconductor wafer, in the process of fabricating semiconductor devices, and more particularly to a plasma processing apparatus wherein the sample is processed while the temperature of the sample stage for holding the sample is being controlled.

It is important to keep the surface of the semiconductor wafer under processing precisely at a predetermined temperature in a fabricating process using such a plasma processing apparatus as mentioned just above wherein the surface of the semiconductor wafer as a sample is processed to form fine patterns serving as semiconductor device circuits with high precision. If the temperature of the wafer surface can be maintained at the optimal value as the steps of the fabrication process proceed, then the selective ratio and the throughput of the processing as well as the precision of working can be improved.

Today, the surface area of the semiconductor wafer to be processed is becoming larger and larger with the result that the high-frequency power consumed in the process is also increasing. Especially, in the process of etching the interlayer insulation films for insulating from one another the multiple layers to serve as semiconductor devices, power in the order of kilowatts must be supplied so as to maintain a high speed in etching. The application of such heavy power causes the increase in the energy of ions bombarding the surface of the semiconductor wafer so that the inflow of heat into the semiconductor wafer also increases. To cope with this increase in the heat inflow, therefore, the sample stage for holding the semiconductor wafer must have such a function that it can adjust the temperature of the wafer to a predetermined value quickly enough against such increase in heat inflow.

In controlling the temperature of wafer surface with such a plasma processing apparatus as described above, the temperature of the sample resting surface, which contacts the semiconductor wafer surface, of the sample stage is made controllable or variable. For example, the sample stage using a conventional technique incorporates therein ducts through which a heat exchange medium of liquid (e.g. fluorinate) passes so as to dissipate such heat inflow as mentioned above, cool the sample stage and keep the wafer surface at a desired temperature.

Such liquid refrigerant is caused to flow through the ducts laid out in the sample stage after it has been adjusted to a predetermined temperature by means of a cooler or a heater installed in a refrigerant supplying apparatus (e.g. chiller unit) communicating with the ducts of the sample stage through a refrigerant pipeline. This refrigerant supplying apparatus has a reservoir such as a tank to contain liquid refrigerant in it and the liquid refrigerant whose temperature has been controlled is pumped out. Since the heat capacity of the liquid refrigerant is large, it is easy to keep the sample stage and the semiconductor wafer placed on it, at a predetermined temperature.

On the other hand, however, there still is a problem that when it is required to change the temperature of the sample stage or the semiconductor wafer, the response in control is poor so that it is difficult to adjust the temperature to a desired value in short time. Further, since the efficiency of heat transfer is low, the flow rate or the pressure of the refrigerant must be increased if there is large heat inflow into the sample stage. This must lead to the increase in the size of the cooling apparatus and therefore the increase in the running cost thereof.

To solve such a problem, there has been provided a plasma processing apparatus having a so-called sample stage of direct refrigerant expansion type (hereafter referred to as DRE type), wherein the sample stage is incorporated in a cooling circuit, that is, wherein a compressor for pressurizing the refrigerant, a condenser for condensing the pressurized refrigerant, an expansion valve for expanding the refrigerant and the sample stage are communicated through refrigerant pipelines so that the sample stage is cooled by the latent heat generated in the evaporation of the liquid refrigerant within the sample stage. This type of sample stage is known as disclosed in the Japanese patent documents such as JP-A-06-346250 and JP-2005-89864. These conventional techniques, provided with the sample stage of DRE type, aim to adjust the semiconductor wafer at a predetermined temperature with high efficiency and speed even in the case of increased heat inflow during the fabrication process.

SUMMARY OF THE INVENTION

According to the cooling method employed in the sample stage of DRE type disclosed in JP-A-06-346250 or JP-2005-89864, the sample stage and the semiconductor wafer as a sample to be processed, placed thereon are cooled by utilizing the latent heat generated in the evaporation of the liquid refrigerant in the refrigerant ducts provided within the sample stage. When the entire refrigerant within the refrigerant ducts has evaporated, that is, there is no more liquid medium for removing latent heat, the cooling capability of the sample stage drops rapidly.

In order to make the temperature distribution over the upper surface of the sample stage uniform, it is necessary to cause the flow rate of the refrigerant in each of the sub-areas constituting the entire upper surface of the sample stage to correspond to the heat inflow into the particular sub-area. When the heat inflow exceeds the limiting value of the refrigerant flow rate corresponding to the refrigerant evaporation in the sub-area, the full evaporation of the refrigerant occurs in the refrigerant duct beneath the sub-area and the downstream part of the refrigerant duct, that is, the refrigerant duct beneath the sub-area and the downstream part thereof become void of liquid refrigerant serving as main heat remover. Consequently, temperatures of the sub-area and the other sub-areas located over the refrigerant ducts downstream of the void duct rise quickly and the uniformity of temperature of the surface of the semiconductor wafer is remarkably degraded.

Therefore, if the rate of heat exchange in the sample stage is lowered by decreasing the rate of flow of refrigerant in the sample stage as according to the conventional technique using refrigerant circulation, in order to elevate the temperature of the semiconductor wafer placed on the sample stage employing such a cooling method as described just above, then the probability of the full refrigerant evaporation becomes greater. On the other hand, if a heater is provided in the sample stage to increase the temperature of the sample stage, the actuation of the heater increases the evaporation of the refrigerant so that to avoid the full evaporation the flow rate of the refrigerant must be increased corresponding to the increase in the heat added due to the actuation of the heater. Accordingly, the heat added by the heater is further absorbed due to the increased evaporation and the control of the heater actuation becomes difficult.

According to the cooling method employed in the sample stage of DRE type disclosed in JP-A-06-346250 or JP-2005-

89864, the controllable range of temperature of the sample stage or the semiconductor wafer is largely affected by the variable range of evaporation temperature of the liquid refrigerant. It is therefore known from this reason that a sufficient consideration has not been given in these conventional methods to the fact that the attainable range of temperature is insufficient.

The object of this invention is to provide a plasma processing apparatus which can change the temperature of the sample stage or the sample placed on the stage over a wide range and within a short period of time, resulting in an improved process efficiency.

This object can be attained with a plasma processing apparatus including a processing chamber encased in a vacuum vessel equipped with an evacuator; a sample stage located in the processing chamber and having an upper surface on which a sample as an object to be processed rests; a gas feeder for feeding processing gas into the processing chamber; a plurality of refrigerant ducts which are laid out in the internal of the sample stage and through which liquid refrigerant flows and is evaporated; and a cooling circuit including a compressor, a condenser, an expansion valve and a set of pipelines to connect the compressor, the condenser and the expansion valve in this order; the sample being processed by using plasma while the temperature of the sample stage is being controlled, wherein the cooling of the sample stage is controlled by causing the refrigerant to flow selectively through the plural refrigerant ducts.

This object can also be attained with a plasma processing apparatus including a processing chamber encased in a vacuum vessel equipped with an evacuator; a sample stage located in the processing chamber and having an upper surface on which a sample as an object to be processed rests; a gas feeder for feeding processing gas into the processing chamber; a plurality of refrigerant ducts which are laid out in the internal of the sample stage and through which liquid refrigerant flows and is evaporated; and a cooling circuit including a compressor, a condenser, an expansion valve and a set of pipelines to connect the compressor, the condenser and the expansion valve in this order; the sample being processed by using plasma while the temperature of the sample stage is being controlled, wherein the liquid refrigerant is caused to flow selectively through at least one of the plural refrigerant ducts in different processing steps for the sample.

This object can still be attained with a plasma processing apparatus including a processing chamber encased in a vacuum vessel equipped with an evacuator; a sample stage located in the processing chamber and having an upper surface on which a sample as an object to be processed rests; a gas feeder for feeding processing gas into the processing chamber; a plurality of refrigerant ducts which are laid out in the internal of the internal of the sample stage and through which liquid refrigerant flows and is evaporated; and a cooling circuit including of a compressor, a condenser, an expansion valve and a set of pipelines to connect the compressor, the condenser and the expansion valve in this order; the sample being processed by using plasma while the temperature of the sample stage is being controlled, wherein each of the refrigerant ducts includes plural grooves having different cross sections, and the cooling of the sample stage is controlled by causing the refrigerant to selectively flow through the plural grooves.

The object of this invention can also be attained by causing the liquid refrigerant to flow selectively through the plural refrigerant ducts depending on the quantity of heat transferred from the plasma to the sample.

The object of this invention can further be attained by making the heat transfer of the refrigerant ducts through which the refrigerant is caused to flow selectively, different from that of the other refrigerant ducts.

The object of this invention can still be attained by making the distance between the upper wall of the refrigerant duct through which the refrigerant is caused to flow selectively and the sample resting surface of the sample stage, different from the distance between the upper wall of at least one of the other refrigerant ducts and the sample resting surface of the sample stage.

The object of this invention can yet further be attained by making the cross section of the refrigerant duct through which the refrigerant is caused to flow selectively, different from the cross section of at least one of the other refrigerant ducts.

The object of this invention can still further be attained by controlling the flow rate of the refrigerant through the refrigerant ducts depending on the result of the detection of the temperature difference between the refrigerant fed into the sample stage and the refrigerant flowing out of the sample stage.

Other objects, features and advantages of the invention will become apparent from the following description of the embodiments of the invention taken in conjunction with the accompanying drawings.

BRIEF DESCRIPTION OF THE EMBODIMENTS

The embodiments of this invention will now be described below with reference to the attached drawings.

Embodiment 1

Figure 1:
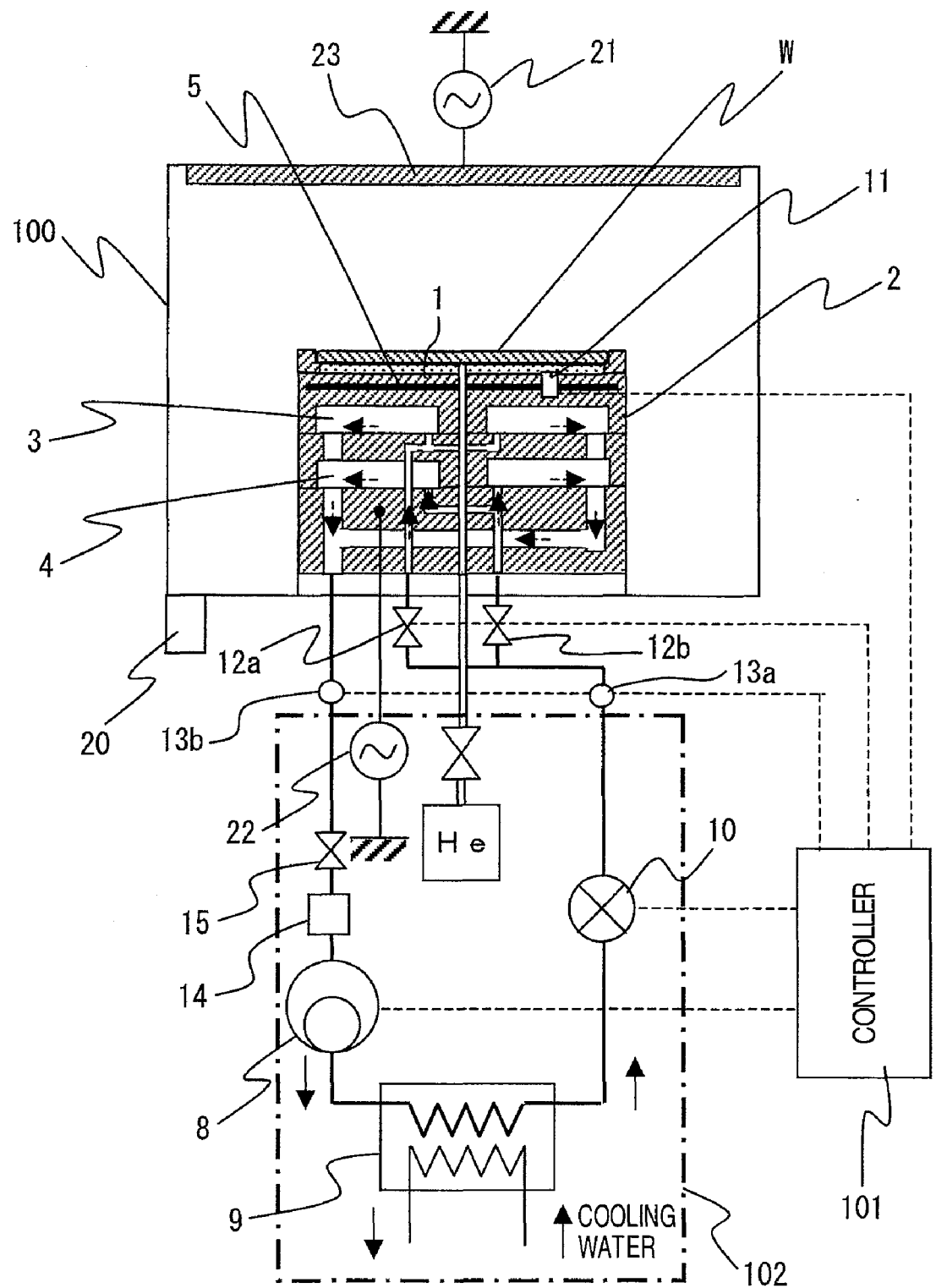
FIG. 1 schematically shows the entire structure of a plasma processing apparatus as one embodiment of this invention.
Figure 2A:
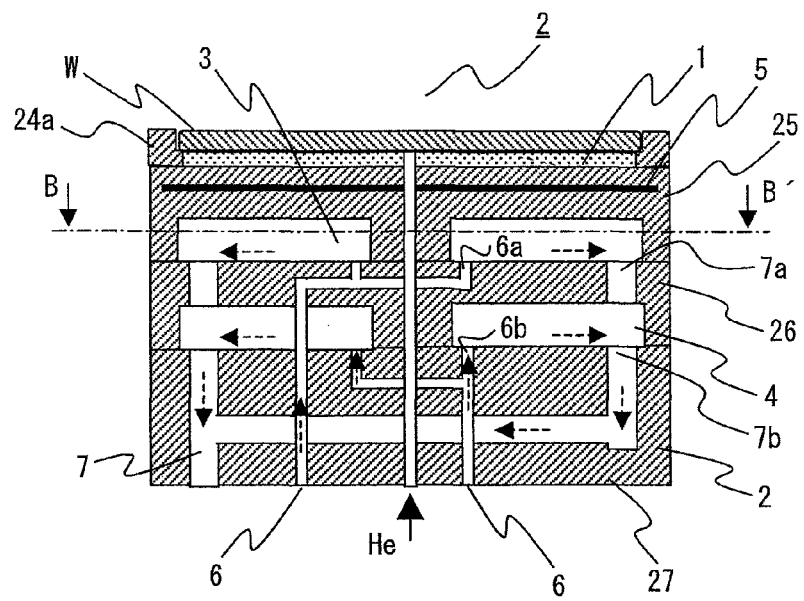
FIGS. 2A through 2C schematically show in cross sections the structure of the sample stage used in the embodiment shown in FIG. 1.
Figure 2B:
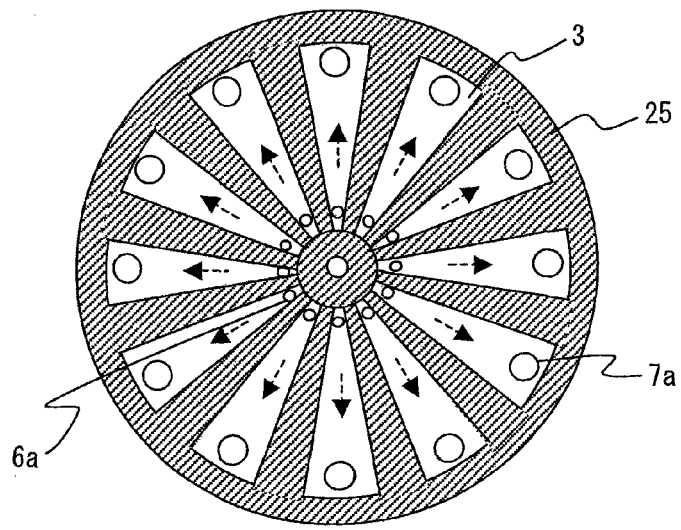
Figure 2C:
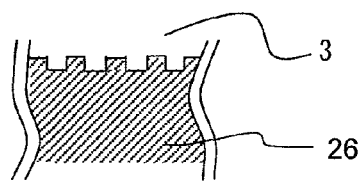
Figure 5:
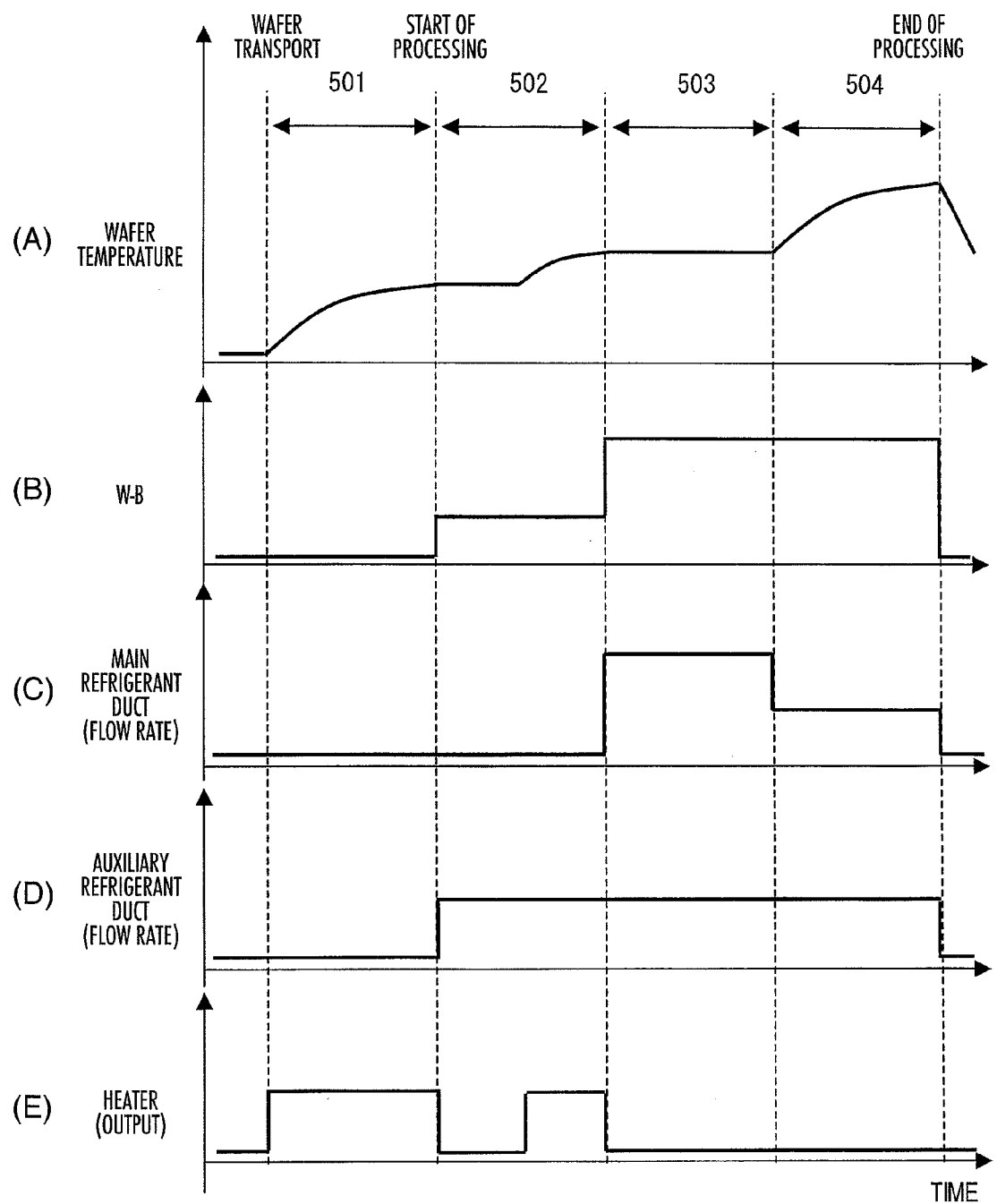
FIG. 5 graphically shows the changes with time of various quantities or states, observed in the operation of the plasma processing apparatus shown in FIG. 1.

A first embodiment of this invention will be described in detail in reference to FIG. 1, FIGS. 2A through 2C, and FIG. 5. FIG. 1 schematically shows the entire structure of a plasma processing apparatus as a first embodiment of this invention. FIGS. 2A through 2C schematically show in cross sections the structure of the sample stage used in the embodiment shown in FIG. 1. FIG. 5 graphically shows the changes with time of various quantities or states, observed in the operation of the plasma processing apparatus shown in FIG. 1.

As shown in FIG. 1, the plasma processing apparatus as the first embodiment of this invention is divided into such main sections as a processing chamber 100 placed in a vacuum vessel, a sample stage 2 located at the central bottom position within the processing chamber 100, a cooling circuit 102 for feeding refrigerant to the sample stage 2 so as to control the temperature of the sample stage 2, and a controller 101 for controlling the operations of the constituents of the plasma processing apparatus. In detail of the sample stage 2, refrigerant ducts for carrying refrigerant are cut in the body of the stage 2 which is made of material having high thermal and electric conductivities such as metal, and a heater 5 is equipped in the stage body over the refrigerant ducts.

On the upper surface of the sample stage 2 is provided an insulation film 1 for electrostatically attracting a sample substrate such as a semiconductor wafer resting thereon. The upper surface of the insulation film 1 serves as a sample holding surface to which the sample W is held. The sample stage 2 containing therein the refrigerant ducts, a compressor 8, a condenser 9, and an expansion valve 10, together with refrigerant pipelines carrying refrigerant and connecting these components, constitute the cooling circuit 102 which uses the sample stage 2 as a refrigerant vaporizer. The condenser 9 works to cool the refrigerant through heat exchange with cooling water fed through the cooling water duct.

In this embodiment, the cooling circuit 102 and the processing chamber 100 containing therein the sample stage 2 can be separated from each other by uncoupling the connector inserted in the refrigerant pipeline feeding the refrigerant from the compressor 8 to the sample stage 2 and the connector inserted in the refrigerant pipeline carrying the refrigerant flowing from the sample stage 2 to the compressor 8.

As shown in FIG. 1, the refrigerant fed from the compressor 8 first passes through the expansion valve 10, bifurcates and flows into the sample stage 2. The first part of the refrigerant is led to the main refrigerant ducts 3 while the second part of the refrigerant is conducted into the auxiliary refrigerant ducts 4. The branched flows of the refrigerant, after passing through the main and auxiliary refrigerant ducts, merge into one stream, which flows out of the sample stage 2 and returns through the refrigerant pipeline to the compressor 8. Flow control valves 12a and 12b serve to control the flow rates of the bifurcated refrigerant flows heading for the main and auxiliary refrigerant ducts 3 and 4, respectively.

Further in this embodiment, between the refrigerant outlet of the sample stage 2 and the refrigerant entrance of the compressor 8 are provided a pressure control valve 15 for controlling the pressure of the refrigerant throughout the refrigerant ducts and pipelines and a vaporizer 14 located downstream of the valve 15, for heating and vaporizing the refrigerant. The flow control valves 12a and 12b are located between the sample stage 2 and the above mentioned connector inserted in the refrigerant pipeline for feeding the refrigerant into the sample stage while the pressure control valve 15 is located between the vaporizer 14 and the above mentioned connector inserted in the refrigerant pipeline for carrying the returning refrigerant flowing out of the sample stage 2. Thus, the flow control valves 12a and 12b and the pressure control valve 15 are all located outside the vacuum vessel encasing the processing chamber 100 therein.

The controller 101 is connected via communication means with and controls with its operation commands, the heater 5, a temperature sensor 11 for the sample W embedded in the insulation film 1 for detecting the temperature of the insulation film 1, the flow control valves 12a and 12b, and the compressor 8, the condenser 9 and the expansion valve 10 constituting the cooling circuit 102. The controller 101 delivers to these controlled components the operation command signals derived on the basis of the output of the temperature sensor 11, data stored in a storage device (not shown in FIG. 1) communicable with the controller 101, and the output of a calculator, so as to adjust the temperature of the sample W or the sample stage 2 at a value desired by a user through the feed-forward or feedback control.

According to this embodiment, in the case of a particular processing, e.g. wherein a single layer on an object to be processed is processed, the controller 101 contained in the plasma processing apparatus obtains the requisite conditions for the processing from the storage device prior to the processing and delivers the operation commands for controlling the output of the compressor 8 and the aperture of the expansion valve 10 prior to the start of the processing according to the obtained conditions. Thus, the rotational speed of the compressor 8 and the aperture of the expension valve 10 are controlled depending on the operation commands so that the temperature (or pressure) and the flow rate of the refrigerant fed from the compressor 8 to the main and auxiliary refrigerant ducts 3 and 4 of the sample stage 2 can be controlled. The flow rate to be set during the control at this time becomes measures to determine the maximum flow rates of the refrigerant fed respectively to the main and auxiliary refrigerant ducts 3 and 4 in the processing described above.

The refrigerant having the thus controlled temperature and flow rate is bifurcated, and flows partially into the main refrigerant ducts 3 of the sample stage 2 and partially into the auxiliary refrigerant ducts 4 of the sample stage 2. The flow rates of the bifurcated streams of the refrigerant are controlled by the flow control valves 12a and 12b depending on the command signals sent from the controller 101.

Then, at the start of processing the sample W, the refrigerant having the preset temperature and flow rate is fed into the sample stage 2. During this processing, the controller 101 controls the heating operation by the heater 5 and the refrigerant flow rates by the flow control valves 12a and 12b depending on the change in the heat inflow into the sample W in accordance with the output signals received from the temperature sensor 11 and other detectors belonging to the cooling circuit 102 such as a refrigerant temperature sensor 13a provided between the point of the refrigerant bifurcation and the expansion valve 10 and a refrigerant temperature sensor 13b provided between the pressure control valve 15 and the sample stage 2.

It is preferable to locate the flow control valves 12a and 12b as near to the sample stage 2 as possible so as to quicken the response of the flow rates of the refrigerant through the main and auxiliary refrigerant ducts 3 and 4. It may also be possible to provide means for controlling the flow rates of refrigerant at the outlets of the main and auxiliary refrigerant ducts 3 and 4 so as to make the pressures or temperatures of the refrigerant in the ducts 3 and 4 high enough by reducing the flow rates of the refrigerant at the outlets. With these controlling means provided at the refrigerant outlets of the refrigerant ducts 3 and 4, the rise time in the operation of the compressor 8 can be shortened and consequently the precision in the control of the temperature of the sample W and the response in control operation can be improved.

In this embodiment, the vaporizer 14 is provided in the refrigerant pipeline between the refrigerant entrance of the compressor 8 and the sample stage 2. The vaporizer 14 vaporizes the insufficiently vaporized refrigerant flowing out of the sample stage 2 before it reaches the compressor 8. Thus, the damage to the compressor 8 due to the introduction thereinto of the refrigerant in the liquid phase and the depression of the output of the cooling circuit 102 can be both prevented. Examples of the vaporizer 14 include a suction tank with a heater installed therein.

The temperature sensor 11 detects directly or indirectly the temperature of the lower surface of the sample W or the insulation film 1 (or of the internal of the sample stage 2 near the sample W). A thermocouple, a fluorescence thermometer or a radiation thermometer can be used as the temperature sensor 11. In this embodiment, it is preferable that the heater 5 equipped in the sample stage 2 has a small heat capacity in consideration of temperature controllability. It is for example possible to elevate the temperature of the upper surface of the insulation film 1, that is the sample holding surface, at a rate of 1° C./sec by embedding a thin film tungsten heater (output rate of higher than 100 W) in the insulation film 1. Heating for the same purpose may also be performed by providing a sheath heater on the surface of the body of the sample stage 2.

According to an example of controlling the output of the heater 5 by the controller 101, before adjusting the temperature of the sample W to its target temperature, the temperature of the sample stage 2 is adjusted to a value somewhat excessively lower (within −5° C.) than the sample stage temperature proper for the intended processing, heating by the heater 5 is initiated simultaneously with the start of the intended processing, and the temperature of the sample stage 2 is elevated near (within ±1° C.) to the target temperature, whereby the temperature of the sample W can be rapidly and precisely controlled.

After the sample W is placed on the upper surface of the insulation film 1, processing gas is introduced into the processing chamber 100 via a pipeline communicating with a gas supply source (not shown) of the processing gas in accordance with the command from the controller 101. Simultaneously, the command from the controller 101 actuates an evacuator 20 such as a vacuum pump, located under the processing chamber 100 and communicating with the chamber 100 so that the processing chamber 100 is evacuated and then maintained at a predetermined pressure.

The sample W placed on the insulation film 1 resting on the upper surface of the sample stage 2 is held onto the insulation film 1 by being attracted to the insulation film 1 due to the electrostatic force generated by the electric power supplied to an electrostatic attraction electrode embedded in the insulation film 1. Further, the interface gap between the lower surface of the sample W and the upper surface of the insulation film 1 is filled with gas having a high heat conductivity so as to enhance the heat transfer from the sample stage 2 to the sample W.

Then, a disc-like antenna 23 made of electric conductor, located at and covering the ceiling of the processing chamber 100 is fed with power of frequencies in the range of VHF or UHF supplied from an antenna power source 21. Consequently, the internal of the processing chamber 100 is filled with electric field radiated from the antenna 20 and this electric field turns into plasma the processing gas introduced into the chamber 100.

In addition, the electrically conductive material constituting the body of the sample stage 2 is supplied with high-frequency power from a biasing power source 22 located under the processing chamber 100. This high-frequency power generates specific electric potentials over the surface of the sample W placed on the sample stage 2. The specific electric potentials accelerate the charged particles of the plasma, causing the accelerated particles to bombard the surface of the sample W to perform a desired plasma processing or etching. Thus, the body of the sample stage 2 serves as an electrode for the plasma.

The structure of the sample stage 2 will now be described in further detail with reference to FIGS. 2A through 2C. As shown in these figures, the main refrigerant ducts 3 and the auxiliary refrigerant ducts 4 (hereafter referred to jointly as the refrigerant ducts) are cut in the internal of the sample stage 2 with the insulation film 1 resting on the upper surface thereof. The heater 5 is embedded in the sample stage 2 beneath the upper surface thereof.

The refrigerant used in this embodiment enters the sample stage 2, flowing first into the refrigerant feed channels provided in the sample stage 2 at their intakes 6 connected with the ends of the refrigerant pipelines communicating with the flow control valves 12a and 12b (not show in FIGS. 2A through 2C). The refrigerant then flows into the main and auxiliary refrigerant ducts 3 and 4 at the feed openings 6a and 6b cut open near the center of the sample stage 2. The refrigerant flows through the main and auxiliary refrigerant ducts 3 and 4 toward the periphery of the sample stage 2 while it is partially vaporized through heat exchange with the sample stage 2. It then flows down via the downflow openings 7a and 7b provided near the periphery of the sample stage 2, merges within the sample stage 2, and finally leaves the sample stage 2 at the refrigerant outlet 7 provided near the bottom periphery of the sample stage 2.

In this embodiment, since the sample W is bombarded, during its processing, with the charged particles such as ions of the plasma accelerated by the bias potentials generated by the high-frequency power supplied to the electrically conductive body of the sample stage 2, the sample W is heated by the plasma through the absorption of heat from the plasma. Accordingly, in order to control the temperature of the sample stage 2 or the sample W itself as required by using the refrigerating circuit 102 of this embodiment, either the vaporizing temperature of the refrigerant is controlled by controlling the pressure of the refrigerant in accordance with the heat inflow into the sample W due to the application of the bias power (hereafter referred to simply as W-B), or the refrigerating capacity of the refrigerant is changed by changing the flow rate of the refrigerant.

According to this embodiment, when the latter of the above mentioned control methods is employed, the flow rate of the refrigerant is so controlled that the full vaporization of liquid refrigerant may not take place in the refrigerant ducts 3 and 4. If such full vaporization takes place in any of the ducts, the even distribution of temperature over the sample surface corrupts rapidly. To keep the even distribution, therefore, it is necessary to control the flow rate of the refrigerant fed into the refrigerant ducts 3 and 4 in response to the above mentioned heat inflow. On the other hand, in this embodiment wherein the temperature of the sample stage 2 is controlled by the refrigerating circuit, the variable range of the sample temperatures is largely affected by the variable range of the refrigerant vaporizing temperatures. To compensate for this weak point, some measure must be employed to prevent the range of available temperatures from being narrowed as compared with the conventional techniques. For example, the use of R410 (hydrofluorocarbon) that is a well-known alternative of the refrigerant Freon (chlorofluorocarbon) causes the controllable region of temperatures to range over −50° C.~70° C.

In the process of etching the insulating film formed in the surface of the sample W, it is mainly required to control the temperature of the sample W arbitrarily over a range of −20~150° C. In this case, it is necessary to attain a higher temperature range as compared with the controllable temperature range for R410.

On the other hand, if the heat inflow into the sample W is increased by supplying W-B in the order of several kilowatts, then since the temperature gradient between the sample W and the refrigerant can be controlled by controlling the heat transfer through the control of the flow rate of the refrigerant fed into the refrigerant ducts, it may seem possible that the temperature of the sample W can be elevated nearly to 150° C. by reducing the refrigerant flow rate to its minimum value possible. However, the present inventors' investigation has revealed that since power in the order of several tens or hundreds of watts results in an insufficient heat inflow, the temperature of the sample W cannot be sufficiently elevated even if the degree of thermal transfer with respect to the refrigerant is reduced.

Accordingly, with relatively low W-B, it is necessary to use a heater 5 to control the temperature of the sample W efficiently. With the sample stage of DRE type using the refrigerating circuit 102 as described above, since the flow rate of the refrigerant must be increased in response to the heat generated by the heater 5, the control of the heat generated by the heater 5 is complicated so that it is difficult to maintain the temperature of the sample uniform over its entire surface. According to this embodiment, therefore, the main and auxiliary refrigerant ducts 3 and 4 which provide different heat transfer or cooling capacities, are laid out within the sample stage 2; the capacity of refrigerating the sample stage 2 is changed by selectively using the refrigerant ducts; the flow rate of the refrigerant is controlled depending on the heat inflow while the full vaporization at a low flow rate is suppressed; and the temperature distribution is made uniform throughout the sample stage 2 by jointly using the heat generated by the heater 5.

The heat transfer or cooling capacities can be changed by changing the distance between the sample W and each of the refrigerant ducts or by changing the material existing between the sample W and the refrigerant ducts. For example, as shown in FIGS. 2A through 2C, the distance between the auxiliary refrigerant ducts 4 and the sample W is maintained greater than the distance between the main refrigerant ducts 3 and the sample W; the supplies of the refrigerant to the refrigerant ducts are selectively changed; and thus the amount of heat exchange between the sample W and the refrigerant flowing through each of the refrigerant ducts can be changed. Consequently, the capability of refrigerating the sample W placed on the sample stage 2 can be made variable.

Since the heat transfer between the sample W and each of the refrigerant ducts decreases as the distance between them increases, then for a fixed refrigerant flow rate the heat transfer or cooling capacity due to the refrigerant flowing through the auxiliary refrigerant duct 4 is smaller than that due to the refrigerant flowing through the main refrigerant duct 3. Hence, the thermal gradient between the auxiliary refrigerant duct 4 and the sample W becomes greater than that between the main refrigerant duct 3 and the sample W so that the capability of refrigerating the sample W can be made smaller for the auxiliary refrigerant duct 4 than for the main refrigerant duct 3. By selectively using the refrigerant ducts in view of this structure of the sample stage 2, the capability of refrigerating the sample W can be made variable depending on the heat inflow into the sample W and the quantity of heat added by the heater 5, whereby the controllable range of the temperature of the sample W can be expanded.

According to this embodiment, the sample stage 2 includes mainly of three, roughly cylindrical members of electrically conductive material, stacked vertically one upon another and the seams between them are hermetically sealed. The top member 25 has the roughly circular insulation film 1 resting on its upper surface and a susceptor ring 24a resting on its upper surface and along its periphery and circling the periphery of the roughly circular insulation film 1.

The lower surface of the top member 25 is in contact with the upper surface of the middle member 26, and the lower surface of the middle member 26 is in contact with the bottom member 27. The top member 25, the middle member 26 and the bottom member 27 are coaxially disposed with respect to the central axis of the roughly cylindrical sample stage 2. Near the center of the sample stage 2 thus assembled is provided a duct for heat transfer gas extending vertically along the central axis. The heat transfer gas duct pierces the sample stage 2 vertically. The upper end of this duct communicates with the through-hole cut in the center of the circular insulation film 1, and heat transfer gas such as He (helium) supplied from a reservoir located below the sample stage 2 flows up the duct and fills the interstitial gap between the upper surface of the insulation film 1 and the lower surface of the sample W placed on the insulation film 1.

Grooves having the vertical cross sections of rectangle are cut radially in the internal of the top member 25 as shown in FIG. 2B. When the top member 25 is stacked on the middle member 26, the grooves serve as the main refrigerant ducts 3 through which the refrigerant flows, as shown in FIG. 2A. As shown in FIG. 2B, the horizontal cross section of each of the main refrigerant ducts 3 is of a narrow sector, each main duct 3 having its refrigerant feed opening 6a near the central axis of the sample stage 2 and its downflow opening 7a near the periphery of the sample stage 2. Within the duct 3, the refrigerant flows in the direction indicated by the arrows.

The middle member 26 also has its internal provided with radial grooves having the horizontal cross sections of narrow sector as shown in FIG. 2B. When the middle member 26 is combined with the bottom member 27, the grooves serve as the auxiliary refrigerant ducts 4. Each of the radial grooves has its refrigerant feed opening 6b near the central axis of the sample stage 2 and its downflow opening 7b near the periphery of the sample stage 2. The refrigerant exiting from the main refrigerant duct 3 at the downflow opening 7a of the main refrigerant duct 3 flows down via a through-hole (not shown) connecting the main refrigerant duct 3 with the refrigerant duct cut in the bottom member 27 into the bottom member 27. On the other hand, the refrigerant exiting from the auxiliary refrigerant duct 4 at the downflow opening 7b of the auxiliary refrigerant duct 4 flows down into the refrigerant duct cut in the bottom member 27. Thus, the refrigerant exiting from the main refrigerant duct 3 and the refrigerant exiting from the auxiliary refrigerant duct 4 merge in the refrigerant duct of the bottom member 27 and the merged refrigerant flow finally leaves the sample stage 2 at the refrigerant outlet 7 provided at the bottom periphery of the sample stage 2.

In this embodiment, the radially disposed main and auxiliary refrigerant ducts 3 and 4 are almost identical with each other in terms of shape and positioning, each duct 3 being located in vertical registration with each corresponding duct 4. If a member having a low heat conductivity or a small heat transfer area is inserted between the main refrigerant ducts 3 and the auxiliary refrigerant ducts 4, the thermal gradient between the auxiliary refrigerant ducts 4 and the sample W can be made greater.

It is also possible to employ a control procedure wherein while refrigerant is always fed through the auxiliary refrigerant ducts 4, refrigerant may be selectively fed into the main refrigerant ducts 3 or the flow rate of the refrigerant through the main refrigerant ducts 3 may be controlled in accordance with the supplied bias power, the change in the heat inflow into the sample W and the heat generated by the heater 5. It is further possible to modify the structure of the radially disposed auxiliary refrigerant ducts 4 in such a manner that the ducts 4 are positioned at different vertical levels in the internal of the middle member 26 so as to cope with the different heat inflows required for different samples or different processings.

Moreover, the refrigerating capability of the sample stage 2 can be controlled by making the pressure of the refrigerant variable. For operations at higher refrigerant pressures, the distance between the main refrigerant duct 3 and the auxiliary refrigerant duct 4 must preferably not be less than 10 mm in consideration of rigidity of the ducts 3 and 4. For example, it may preferably be in the range of 10~200 mm to prevent the heat transfer from decreasing and the size of the sample stage 2 from becoming large.

Further, the heat transfer in the sample stage 2 can be improved by making the inner surface of each of the main refrigerant duct 3 and the auxiliary refrigerant duct 4 rough, e.g. interspersed with projections as shown in FIG. 2C, so that the refrigerant passing through the duct can be agitated. If, however, the roughness of the duct surface is too large, it causes an appreciable loss of refrigerant pressure. The degree of the roughness, therefore, must be optimally designed in consideration of the heat transfer and the pressure loss. If the height of the projections is more than 2% of the duct width or diameter, the heat transfer can be improved. It is especially preferable to adjust the height percentage to 2~10%.

FIG. 5 graphically shows the changes with time of various quantities or states, observed in the plasma processing apparatus shown in FIG. 1. In FIG. 5, the process of temperature control as well as the temperature variation in the sample W are graphically shown.

In the step 501, by means of a sample carrier such as a robot arm (not shown), the sample W is transported through an evacuated transport chamber communicating with the vacuum vessel containing the processing chamber 100, into the processing chamber 100, and then onto the sample resting surface of the sample stage 2. The sample W is fixed on the sample stage by the electrostatic force as described above. Then, the temperature sensor 11 detects the temperature of the sample W and delivers its output relating to the temperature of the sample W to the controller 101. Receiving this output, the controller 1 delivers in turn a command to the heater 5 depending on the output of the temperature sensor 11. Consequently, the heater 5 is actuated to produce heat to perform the initial control of the sample temperature.

Thereafter, in the step 502, while the processing chamber 100 is evacuated to a preset pressure by the evacuator 20, processing gas for etching the sample W is fed through a gas pipeline (not shown) into the processing chamber 100, diffusing over the sample stage 2. Then, after the controller 101 has ascertained that the pressure in the processing chamber 100 is stabilized, the controller 101 instructs the antenna power source 21 and the bias power source 22 to supply power to the antenna 23 and the electrode provided in the sample stage 2. Consequently, due to the interaction between the electric field established over the sample stage 2 and the magnetic field generated by a magnetic field generator (not shown), the processing gas is excited to form plasma, initiating the etching of the sample W.

During this processing, the controller 101 detects the signal of information on temperature derived from the temperature sensor 11; the commands are calculated through the feedback of the information and then sent to the cooling circuit 102 and the various power sources; the operations of the compressor 8, the expansion valve 10 and the heater 5 are controlled by the commands; and consequently the flow rate of the refrigerant, the vaporizing temperature of the refrigerant and the heat generate by the heater 5 are controlled to finally control the temperature of the sample W. In this embodiment, during the step 502 taking place at the early stage of etching, W-B is set at a low level. In this case, only the auxiliary refrigerant ducts 4 are selectively fed with refrigerant to control the temperature of the sample W.

The flow rate control valves 12a and 12b serve to select the main refrigerant ducts 3 or the auxiliary refrigerant ducts 4. When the refrigerant is flowing through the auxiliary refrigerant ducts 4, the heater 5 can be actuated to control the temperature of the sample W, if necessary. The refrigerant temperature sensors 13a and 13b are provided near the refrigerant intake and outlet, and especially in this embodiment respectively on the refrigerant pipeline located between the flow rate control valves (12a and 12b) and the cooling circuit 102 and on the refrigerant pipeline located between the refrigerant outlet of the sample stage 2 and the cooling circuit 102, as shown in FIG. 1. The controller 101 detects the temperature difference between the incoming refrigerant and the outgoing refrigerant on the basis of the outputs of these sensors 13a and 13b, and then detects the degree of vaporization of refrigerant flowing though the refrigerant ducts. The flow rate of the incoming refrigerant is controlled on the basis of the detected degree of vaporization, to prevent the full vaporization from occurring in each of the refrigerant ducts. Since the temperature of the fully evaporated refrigerant becomes abnormally high, the occurrence of full vaporization can be detected by comparing the temperature difference between the incoming refrigerant and the outgoing refrigerant, with a predetermined value.

In the step 503, when a high W-B is supplied, the controller 101 sends a command to the flow rate control valve 12a to cause it to feed refrigerant to the main refrigerant ducts 3 so as to attain a required cooling capability. The flow of refrigerant through the main ducts 3 increases the refrigerating capacity of the sample stage 2 so that the elevation of the sample temperature is suppressed, whereby the sample temperature is adjusted to a desired value.

In the step 504, if the temperature of the sample W needs to be further elevated even under the high W-B application, the heat transfer is to be reduced by reducing the rate of the refrigerant flow through the main refrigerant ducts 3 to the minimum value below which the full vaporization may occur. If the heater 5 has a capacity to generate more power than the current W-B value, such sample temperature control can be performed by controlling the heater 5. If, however, the current W-B value is already in the order of several kilowatts, the provision of such a heater as having a larger heating capacity is difficult in view of the structure of the sample stage 2 and its cost. Moreover, since a heater having such a large heating capacity usually has a poor controllability, it is preferable to control the temperature of the sample W with the refrigerating capacity of refrigerant.

The etching of the insulation film in the upper surface of the sample is completed after the completion of the steps of the processing as described above. Simultaneously with the completion of the etching, the powers, the magnetic field and the supply of the processing gas are all switched off. In the foregoing description is explained an example of controlling the sample temperature with the refrigerating capacity of refrigerant. It is however possible to control the sample temperature by controlling the pressure of refrigerant and thereby controlling the vaporizing temperature of refrigerant. Further, if a pressure control valve is additionally provided, besides the expansion valve 15, before the compressor 8 so as to control the pressure of refrigerant in the refrigerant ducts, the intake flow of refrigerant into the compressor 8 becomes controllable, whereby the range of increase in the pressure in the refrigerant ducts can be expanded.

[Modification 1]

Figure 3A:
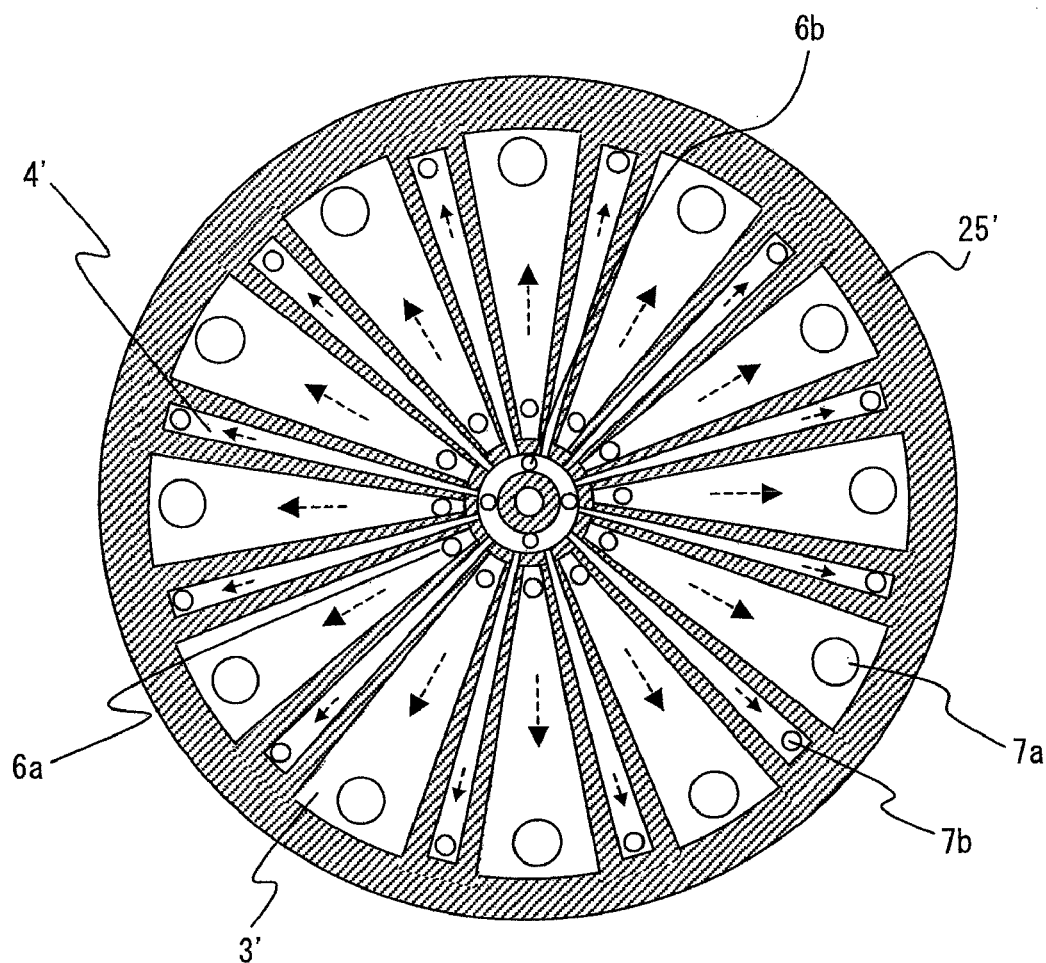
FIGS. 3A and 3B schematically show in cross sections the structure of the sample stage used in a variation of the embodiment shown in FIG. 1.
Figure 3B:
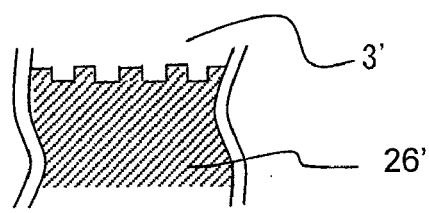

FIGS. 3A and 3B show a first modification of the embodiment of this invention. FIG. 3A shows in horizontal cross section the structure of a modified sample stage for the plasma processing apparatus shown in FIG. 1.

As shown in FIG. 3A, the modified sample stage has the internal of its top member 25' so cut as to define main refrigerant ducts 3' and auxiliary refrigerant ducts 4' approximately at the same vertical level, the ducts 3' and 4' having the horizontal cross section of a narrow sector. The grooves radially arranged from the central axis toward the periphery, of the sample stage and serving as the main refrigerant ducts 3' are alternated with the grooves radially arranged from the central axis toward the periphery, of the sample stage and serving as the auxiliary refrigerant ducts 4'.

In this modified embodiment, the heat transfer area of each auxiliary duct 4' is made smaller than that of each main duct 3', that is, the central angle of sector is larger for the duct 3' than for the duct 4'. The difference in the central angles lead to the difference in the heat transfer areas, and therefore in the heat transfer capacities.

By providing the sample stage 2 with different kinds of refrigerant ducts 3' and 4' having different heat transfer areas as in the modified embodiment of this invention, and selectively feeding the ducts 3' or 4' with refrigerant, the capacity of refrigerating the sample stage 2 can be increased or decreased. Thus, this modified embodiment, too, can realize the uniform temperature distribution throughout the sample W within a wide range of temperatures. The reduction ratio of heat transfer, i.e. the ratio of the sector area of the duct 4' to the sector area of the duct 3' can be designed in consideration of the heat inflow into the sample W in the etching process. For example, since the change in the heat inflow is large in the continuous process of a mask and an HARC (High Aspect Ratio Contact) of the insulation film etching the reduction ratio may preferably be 50~90%.

It is also possible to make the inner surfaces of the main refrigerant ducts 3' and the auxiliary refrigerant ducts 4' rough, e.g. interspersed with projections as shown in FIG. 3B, so as to improve the heat transfer in the sample stage 2, and to dispose the auxiliary refrigerant ducts 4' at different vertical levels, just as in the unmodified embodiment described above.

Embodiment 2

Figure 4A:
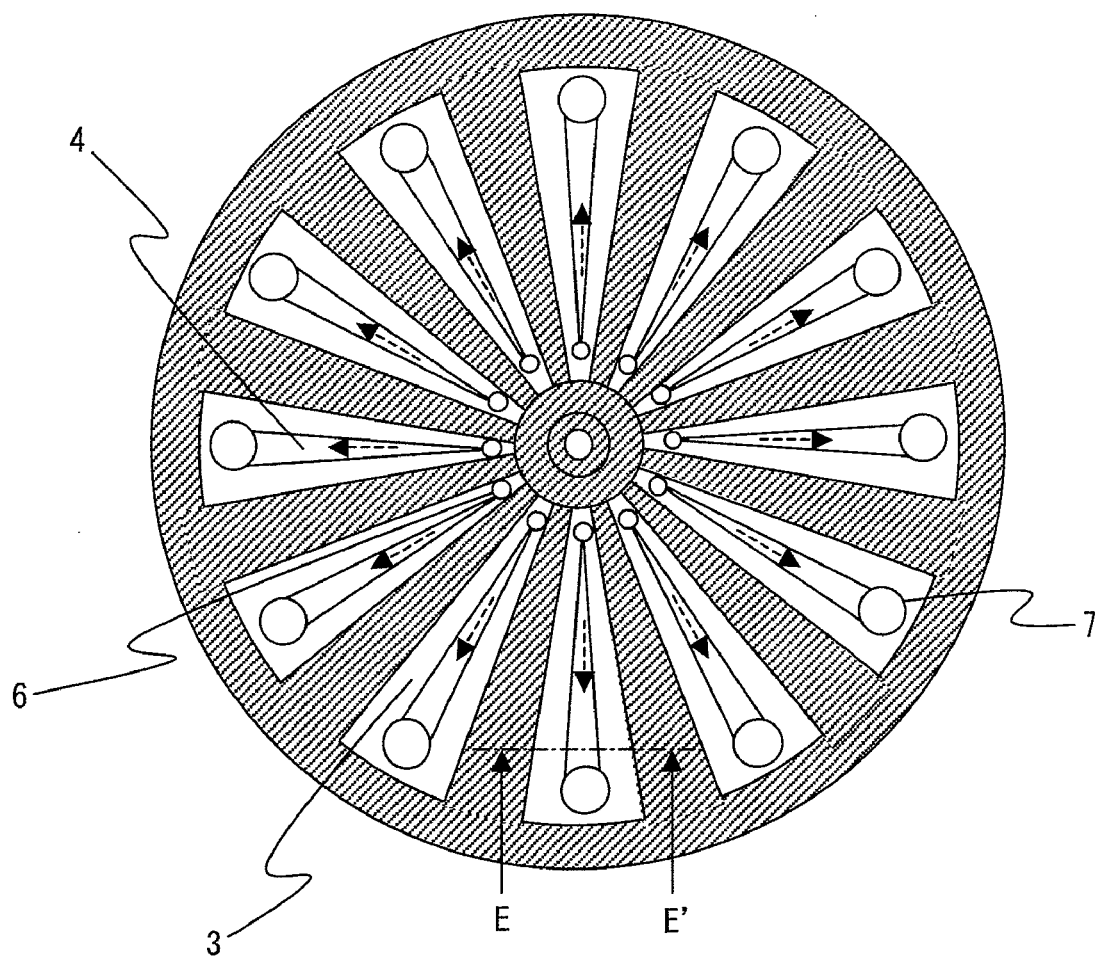
FIGS. 4A and 4B schematically show in cross sections the structure of the sample stage used in a plasma processing apparatus as another embodiment of this invention.
Figure 4B:
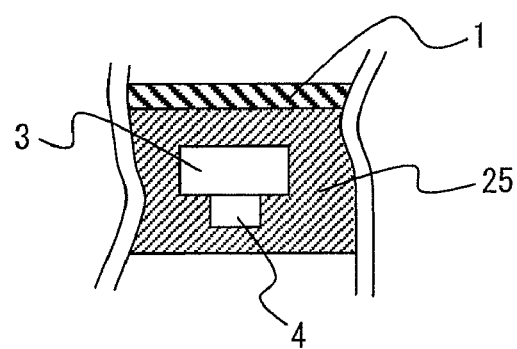

A second modification of the embodiment shown in FIG. 1 will be described below with reference to FIGS. 4A and 4B. FIG. 4A schematically shows in horizontal cross section the structure of the sample stage used in a plasma processing apparatus as another embodiment of this invention.

As shown in FIGS. 2A and 2B, a main refrigerant duct 3 and an auxiliary refrigerant duct 4 are provided in a single groove so that the heat transfer area of each groove varies depending on the change in the amount of refrigerant flow through the groove. The main refrigerant ducts 3 are cut in the internal of the top member 25 of the sample stage, arranged radially from the central axis of the stage toward the periphery of the stage, and each duct 3 has the horizontal cross section of a narrow sector. Each of the auxiliary refrigerant ducts 4, having the horizontal cross section of a narrower sector, is cut in the bottom surface of each main duct 3. FIG. 2B is a vertical cross section along the line E-E' of section in FIG. 4A, showing the vertical structural relationship between the main and auxiliary ducts 3 an 4.

Thus, a main duct 3 and an auxiliary duct 4 constitute a composite duct having a sunken bottom. In this embodiment, only a single sunken bottom is provided in each main duct, but it is possible to provide each main duct with multiple sunken bottoms. In such a case, the vertical cross section of the composite duct along a line of section similar to the line E-E' of section in FIG. 4A looks like the side view of an inverted ziggurat (stepped pyramid) on a reduced scale.

In this embodiment, each composite refrigerant duct is fed with refrigerant from a refrigerant feed opening 6c and drained at a refrigerant outlet 7c. If the rate of the flow of the refrigerant fed into the composite refrigerant duct at the feed opening 6c cut open in the composite duct near the central axis of the sample stage 2 is low, the refrigerant flows along in the sunken groove serving as the auxiliary refrigerant duct 4 while being partially vaporized and exchanging heat with the top member 25, and flows out of the outlet 7c cut open in the composite duct near the periphery of the top member 25. When the heat inflow into the sample W is increased, or when the amount of the heat exchange with refrigerant needs to be increased due to the increase in the heat generated by the heater 5, the flow rate of the refrigerant fed into the top member 25 is increased in response to the command from the controller 101. Consequently, the refrigerant fed into each composite duct at the feed opening 6c flows along in the wider groove serving as the main refrigerant duct 3 as well as the narrower, sunken groove serving as the auxiliary refrigerant duct 4, while exchanging heat with the top member 25, and flows out of the outlet 7c.

The idea of this embodiment can be applied to the modified example as described above. It is therefore possible to provide a structure wherein, in the top member 25, the distance between each main refrigerant duct 3 and the insulation film 1 is made smaller than the distance between each auxiliary refrigerant duct 4 and the insulation film 1, and the heat transfer area is smaller for each auxiliary duct 4 than for each main duct 3.

Moreover, this invention will be still effective even where the processing plasma is generated by the application of that high-frequency power to the electrode disposed opposite to the sample W which is other than the high-frequency power applied to the sample W, by the use of inductive coupling or the interaction between magnetic field and high-frequency electric power, or by the application of high-frequency power to the sample stage 2. Furthermore, this invention is applicable to a processing where a great heat inflow occurs such that high-frequency power of more than 3 W/cm2 is applied to the sample W, and therefore this invention is useful in the processing where high-aspect, long holes having an aspect ratio of more than 15 are to be created. The thin film to be subjected to the plasma processing under consideration may include a single-layer film having as its main composition one of chemical compounds $SiO_2$, $Si_3N_4$, SiOC, SiOCH and SiC, or a multi-layer film including more than one sort of layer, each layer being made of one of the above mentioned chemical compounds.

According to the embodiments of this invention as described above, the plural refrigerant ducts are provided in the sample stage 2, the heat transfer with the refrigerant flowing though the refrigerant ducts is made variable, and the refrigerating capacity is changed by selectively feeding the refrigerant ducts with refrigerant, whereby the refrigerating capacity of the sample stage 2 can be controlled through the selection of the refrigerant ducts. Further, the refrigerant temperature sensors are provided near the refrigerant intake and outlet respectively, and the flow rate of the refrigerant is controlled by making a detection of how the refrigerant in the ducts is vaporized depending on the temperature difference obtained from the outputs of these refrigerant temperature sensors, whereby the full vaporization can be prevented in each refrigerant duct, the temperature of the sample can be controlled over a wide rage in response to the change in the heat inflow into the sample or the heat generated by the heater, and the uniformity in the temperature distribution throughout the sample can be improved.

The temperature control method and constitution employed in the plasma processing apparatus described above can be applied not only to the plasma etching apparatus embodying this invention, but also to the ashing apparatus (?), sputtering apparatus, ion implantation apparatus, photoresist application apparatus, plasma CVD apparatus, etc. all of which need to rapidly elevate the temperature of the wafer to be processed to a desired value and to keep the entire processed surface of the wafer uniformly at the desired temperature over a wide range of temperatures. In such applications, of course, the same effects can be obtained as in the embodiments of this invention.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus comprising:
a processing chamber encased in a vacuum vessel equipped with an evacuator, the processing chamber being configured to process a sample located therein using a plasma generated in the processing chamber;
a sample stage located in the processing chamber and having an upper surface on which the sample to be processed is located;
a gas feeding unit for feeding processing gas into the processing chamber;
a plurality of liquid refrigerant ducts which have different cooling capacities are disposed internally of the sample stage, liquid refrigerant being provided through the plurality of refrigerant ducts and being evaporated by heat generated internally of the sample stage during processing of the sample, one of the plurality of liquid refrigerant ducts having a first cooling capacity being disposed at a first distance between an inner wall thereof and the upper surface of the sample stage and another of the plurality of liquid refrigerant ducts having a second cooling capacity which is lower than the first cooling capacity being disposed at a second distance between an inner wall of the another of the plurality of liquid refrigerant ducts and the upper surface of the sample stage which is larger than the first distance so that the one and the another of the plurality of liquid refrigerant ducts are disposed substantially in parallel within the sample stage and are interconnected through a down flow opening, and the liquid refrigerant being selectively flown into the one and the another of the plurality of liquid refrigerant ducts;
a cooling circuit mainly including the plurality of liquid refrigerant ducts, a compressor, a condenser, an expansion valve, and a set of pipelines which connect the compressor, the condenser, the expansion valve and the plurality of liquid refrigerant ducts in this order, the liquid refrigerant flows in this order along the set of pipelines and circulates in the cooling circuit, and the set of pipelines of the cooling circuit including two parallel installed lines of the liquid refrigerant which are branched on an upstream side of the plurality of liquid refrigerant ducts and connect respectively to the one and the another of the plurality of liquid refrigerant ducts, and one line at which a downstream side of the one and the another of the plurality of liquid refrigerant ducts are interconnected through the down flow opening;
a selecting unit which selects one of the two parallel installed lines for the liquid refrigerant to flow the liquid refrigerant through the selected one parallel installed line; and
a control unit which sends a command of selecting the one of the two parallel installed lines for flowing the liquid refrigerant therethrough to the selecting unit and adjusts at least one of a flow rate and a pressure of the liquid refrigerant flowing into one of the one and the another of the plurality of liquid refrigerant ducts corresponding to the selected one of the two parallel installed lines;
wherein the sample is processed by using plasma generated within the processing chamber while a temperature of the sample stage is controlled by the liquid refrigerant flowing through the cooling circuit and the one of the one and the another of the plurality of liquid refrigerant ducts.

2. A plasma processing apparatus as claimed in claim 1, wherein the control unit selects one of the one and the another of the liquid refrigerant ducts to flow the liquid refrigerant through the selected one liquid refrigerant duct, sends a command of selecting one of the parallel installed lines for flowing the liquid refrigerant therethrough to the selecting unit according to the selection of one of the plurality of liquid refrigerant ducts, and adjusts the at least one of the flow rate and the pressure of the liquid refrigerant flowing through the one and the another of the plurality of liquid refrigerant ducts depending on the quantity of heat transferred from the plasma to the sample.

3. A plasma processing apparatus as claimed in claim 1, wherein the one of the plurality of liquid refrigerant ducts through which the liquid refrigerant is fed has a cross section which is different from a cross section of the another of the plurality of liquid refrigerant ducts.

4. A plasma processing apparatus as claimed in claim 1, wherein the control unit adjusts the flow rates of the liquid refrigerant fed into the one and the another of the plurality of liquid refrigerant ducts depending on a result of a detection of the temperature difference between the liquid refrigerant fed into the sample stage and the liquid refrigerant flowing out of the sample stage.

5. A plasma processing apparatus according to claim 1, wherein each of the plurality of liquid refrigerant ducts is arranged to extend from substantially a center of the sample stage toward an outer periphery of the sample stage substantially in parallel to the upper surface of the sample stage so that the liquid refrigerant flows through the plurality of liquid refrigerant ducts from the center of the sample stage toward the outer periphery of the sample stage.

6. A plasma processing apparatus as claimed in claim 1, wherein the control unit controls at least one flow control valve provided in the cooling circuit to thereby adjust the flow rate of the liquid refrigerant flowing into the plurality of liquid refrigerant ducts.

7. A plasma processing apparatus as claimed in claim 1, wherein the control unit controls the compressor and the expansion valve to thereby adjust the pressure of the liquid refrigerant flowing into the plurality of liquid refrigerant ducts.

8. A plasma processing apparatus as claimed in claim 1, wherein the control unit initially selects only one of the one and the another of the plurality of liquid refrigerant ducts for flowing the liquid refrigerant therein during processing of the sample.

9. A plasma processing apparatus comprising:
a processing chamber encased in a vacuum vessel equipped with an evacuator, the processing chamber being configured to process a sample located therein using a plasma generated in the processing chamber;
a sample stage located in the processing chamber and having an upper surface on which the sample as an object to be processed is located;
a gas feeding unit for feeding processing gas into the processing chamber;
a plurality of liquid refrigerant ducts which have different cooling capacities are disposed internally of the sample stage, liquid refrigerant being provided through the plurality of refrigerant ducts and being evaporated by heat generated internally of the sample stage during processing of the sample, one of the plurality of liquid refrigerant ducts having a first cooling capacity being disposed at a first distance between an inner wall thereof and the upper surface of the sample stage and another of the plurality of liquid refrigerant ducts having a second cooling capacity which is lower than the first cooling capacity being disposed at a second distance between an inner wall of the another of the plurality of liquid refrigerant ducts and the upper surface of the sample stage which is larger than the first distance so that the one and the another of the plurality of liquid refrigerant ducts are disposed substantially in parallel within the sample stage and are interconnected through a down flow opening, and the liquid refrigerant being selectively flown into the one and the another of the plurality of liquid refrigerant ducts;
a cooling circuit mainly including the plurality of liquid refrigerant ducts, a compressor, a condenser, an expansion valve, and a set of pipelines which connect the compressor, the condenser, the expansion valve and the plurality of liquid refrigerant ducts in this order, the liquid refrigerant flows in this order along the set of pipelines and circulates in the cooling circuit, and the set of pipelines of the cooling circuit comprising two parallel installed lines of the liquid refrigerant which are branched on an upstream side of the plurality of liquid refrigerant ducts and connect respectively to the one and another of the plurality of liquid refrigerant ducts, and one line at which a downstream side of the plurality of liquid refrigerant ducts are interconnected through the down flow opening; and
a selecting unit which selects one of the two parallel installed lines for the liquid refrigerant to flow the liquid refrigerant through the selected one parallel installed line;
a control unit which includes a circulator and a storage device sends a command of selecting the one of the two parallel installed lines for flowing the liquid refrigerant therethrouqh to the switching unit, and adjusts at least one of a flow rate and a pressure of the liquid refrigerant flowing into the plurality of liquid refrigerant ducts during processing of the sample;
wherein the sample is processed by using plasma generated within the processing chamber while a temperature of the sample stage is controlled by the liquid refrigerant flowing through the cooling circuit and the one of the one and the another of the plurality of liquid refrigerant ducts corresponding to the selected one of the two parallel installed lines.

10. A plasma processing apparatus as claimed in claim 9, wherein the control unit selects one of the one and the another of the liquid refrigerant ducts to flow the liquid refrigerant through the selected one liquid refrigerant duct, sends a command of selecting one of the parallel installed lines for flowing the liquid refrigerant therethrouqh to the selecting unit according to the selection of one of the plurality of liquid refrigerant ducts, and sends a command to at least one of the compressor and the expansion valve so as to adjust the at least one of the flow rate and the pressure of the liquid refrigerant flowing through the one and the another of the plurality of liquid refrigerant ducts depending on the different heat inflows from the plasma into the sample in the different steps of the processing.

11. A plasma processing apparatus as claimed in claim 9, wherein the at least one of the liquid plurality of refrigerant ducts through which the refrigerant is fed has a cross section which us different from a cross section of the at least another of the plurality of liquid refrigerant ducts.

12. A plasma processing apparatus as claimed in claim 9, wherein the control unit adjusts the flow rates of the liquid refrigerant fed into the plurality of liquid refrigerant ducts depending on a result of the detection of a temperature difference between the liquid refrigerant fed into the sample stage and the liquid refrigerant flowing out of the sample stage.

13. A plasma processing apparatus according to claim 9, wherein each of the plurality of liquid refrigerant ducts is arranged to extend from substantially a center of the sample stage toward an outer periphery of the sample stage substantially in parallel to the upper surface of the sample stage so that the liquid refrigerant flows through the plurality of liquid refrigerant ducts from the center of the sample stage toward the outer periphery side of the sample stage.

14. A plasma processing apparatus as claimed in claim 9, wherein the control unit controls at least one flow control valve provided in the cooling circuit to thereby adjust the flow rate of the liquid refrigerant flowing into the plurality of liquid refrigerant ducts.

15. A plasma processing apparatus as claimed in claim 9, wherein the control unit controls the compressor and the expansion valve to thereby adjust the pressure of the liquid refrigerant flowing into the plurality of liquid refrigerant ducts.

16. A plasma processing apparatus as claimed in claim 9, wherein the control unit initially selects only one of the one and the another of the plurality of liquid refrigerant ducts for flowing the liquid refrigerant therein during processing of the sample.

\* \* \* \* \*